United States Patent
Lee et al.

(10) Patent No.: US 12,501,760 B2
(45) Date of Patent: Dec. 16, 2025

(54) PEROVSKITE SOLAR CELL AND MANUFACTURING METHOD THEREFOR

(71) Applicant: GWANGJU INSTITUTE OF SCIENCE AND TECHNOLOGY, Gwangju (KR)

(72) Inventors: Kwang Hee Lee, Gwangju (KR); Hee Joo Kim, Gwangju (KR); Yong Ryun Kim, Gwangju (KR)

(73) Assignee: GWANGJU INSTITUTE OF SCIENCE AND TECHNOLOGY (KR)

( * ) Notice: Subject to any disclaimer, the term of this patent is extended or adjusted under 35 U.S.C. 154(b) by 125 days.

(21) Appl. No.: 18/271,411

(22) PCT Filed: Apr. 11, 2022

(86) PCT No.: PCT/KR2022/005171
§ 371 (c)(1),
(2) Date: Jul. 7, 2023

(87) PCT Pub. No.: WO2022/265207
PCT Pub. Date: Dec. 22, 2022

(65) Prior Publication Data
US 2024/0079186 A1    Mar. 7, 2024

(30) Foreign Application Priority Data
Jun. 17, 2021   (KR) .................. 10-2021-0078854

(51) Int. Cl.
*H10K 30/84* (2023.01)
*H01G 9/00* (2006.01)
(Continued)

(52) U.S. Cl.
CPC ........... *H10K 30/84* (2023.02); *H01G 9/0036* (2013.01); *H01G 9/2009* (2013.01); *H10K 30/40* (2023.02);
(Continued)

(58) Field of Classification Search
None
See application file for complete search history.

(56) References Cited

U.S. PATENT DOCUMENTS

2020/0106019 A1 * 4/2020 Palmstrom ............. H10K 30/30
2020/0343489 A1 * 10/2020 Park ...................... H10K 50/135

FOREIGN PATENT DOCUMENTS

KR      20170002967 A      1/2017
KR       102089612 B1       3/2020
(Continued)

OTHER PUBLICATIONS

F. Huang, et al., "Novel electroluminescent conjugated polyelectrolytes based on polyfluorene", Chemical Materials 16, p. 708-716 (Year: 2004).*
(Continued)

*Primary Examiner* — Ryan S Cannon
(74) *Attorney, Agent, or Firm* — Renaissance IP Law Group LLP

(57) ABSTRACT

Provided is a perovskite solar cell. The perovskite solar cell includes a bottom electrode; a hole transport layer formed on the bottom electrode; a first polymer electrolyte layer formed on the hole transport layer and including a halide; a perovskite photoactive layer formed on the first polymer electrolyte layer; an electron transport layer formed on the perovskite photoactive layer; a second polymer electrolyte layer formed on the electron transport layer and including an amine group; and a top electrode formed on the second polymer electrolyte layer.

8 Claims, 7 Drawing Sheets

(51) Int. Cl.
H01G 9/20 (2006.01)
H10K 30/40 (2023.01)
H10K 30/80 (2023.01)
H10K 30/86 (2023.01)
H10K 30/50 (2023.01)

(52) U.S. Cl.
CPC ............ H10K 30/80 (2023.02); H10K 30/86 (2023.02); *H10K 30/50* (2023.02)

(56) References Cited

FOREIGN PATENT DOCUMENTS

KR 102121413 B1 6/2020
KR 102187776 B1 12/2020

OTHER PUBLICATIONS

T. Do et al., "Synthesis and characterization of conjugated oligoelectrolytes based on fluorene and carbazole derivative and application of polymer solar cell as cathode buffer layer", Macromolecular Research 23 (4), p. 367-376 (Year: 2015).*
Y. Kim, et al., "Conjugated polyelectrolytes for stable perovskite solar cells based on methylammonium lead triiodide", Journal of Materials Chemistry A 10, p. 3321 (Year: 2022).*
International Search Report for PCT/KR2022/005171 mailed Jul. 15, 2022.
Kim, Yong Ryun et al., "Highly stable and efficient cathode-buffer-layer-free inverted perovskite solar cells", Nanoscale, Issue 11, 2021,13, 5652-5659.

* cited by examiner (a) Thermal stability (b) Temperature cycling experiment (c) Photostability (d) Air stability

PEROVSKITE SOLAR CELL AND MANUFACTURING METHOD THEREFOR

TECHNICAL FIELD

The present inventive concept relates to a perovskite solar cell, and more particularly, to a perovskite solar cell with high storage stability against heat, light, and air.

BACKGROUND ART

Silicon solar cells have limitations in replacing existing power sources due to high manufacturing costs and power generation costs, but perovskites are attracting great attention because they can be manufactured at a very-low cost and have efficiency approaching that of silicon.

A perovskite solar cell is currently in the limelight as the most promising next-generation solar cell candidate because of the advantages of being able to manufacture a device using a solution process and a high-efficiency device based on a high adsorption coefficient.

However, existing perovskite solar cells have problems of a phenomenon (hysteresis) in which efficiency rapidly drops because the migration rates of electrons and holes generated in the cells do not match, and decreased long-term stability and an increased unit price in the manufacturing process due to the corrosion of elements by titanium dioxide and additives, which are added to improve this phenomenon.

Inverted perovskite solar cells have been proposed to address the efficiency reduction and instability, which hinder the commercialization of perovskite solar cells attracting attention as a next-generation element to replace silicon solar cells.

An inverted perovskite solar cell may have a structure in which an organic material capable of transferring negatively-charged electrons and positively-charged virtual particles, holes, is attached to upper and lower surfaces of the perovskite. As a method of attaching a conductive polymer to the upper and lower surfaces of the perovskite without using additives and making a migration path for electrons and holes, a technology having a high efficiency of 18.1% and addressing the corrosion caused by additives has been disclosed.

This perovskite thin-film solar cell operates in an inverted structure in which electrons move to the opposite side of the side receiving light, unlike a conventional perovskite solar cell in which electrons flow to the side receiving sunlight.

In the case of this inverted perovskite solar cell, since all of electrodes, an n-type functional layer, a p-type functional layer, and a perovskite photoactive layer can be implemented using a solution process and a low-temperature process, it can be manufactured on a flexible substrate, as well as a general glass substrate.

However, despite this advantage, due to the instability of a material of the perovskite layer, when the perovskite layer is exposed to heat, air, and light, the performance of a device is lowered and thus the lifetime is shortened.

In one example, when a perovskite is used for a photoactive layer, theoretically, it shows high photoelectric conversion efficiency, but in actual operation, the elution of halide ions is problematic. This is due to ionic bonds formed in the perovskite crystal structure. That is, since halide ions are arranged in the plane in the crystal structure of the perovskite, the halide element is released from the surface, and when the crystal structure is damaged by the release, exciton quenching may occur due to the aggregation of crystals.

Accordingly, it is necessary to develop a perovskite optoelectronic device or solar cell structure, which can address the instability of a perovskite layer when exposed to heat, air, and light.

DISCLOSURE

Technical Problem

The present inventive concept is directed to providing a perovskite solar cell with high storage stability against heat, light, and air.

However, technical problems to be solved in the present inventive concept are not limited to the above-described problems, and other problems which are not described herein will be fully understood by those of ordinary skill in the art to which the present inventive concept belongs from the following descriptions.

Technical Solution

One aspect of the present inventive concept provides a perovskite solar cell. The perovskite solar cell includes a bottom electrode; a hole transport layer formed on the bottom electrode; a first polymer electrolyte layer formed on the hole transport layer and including a halide; a perovskite photoactive layer formed on the first polymer electrolyte layer; an electron transport layer formed on the perovskite photoactive layer; a second polymer electrolyte layer formed on the electron transport layer and including an amine group; and an top electrode formed on the second polymer electrolyte layer.

In one embodiment of the present inventive concept, a polymer included in the first polymer electrolyte layer may include a halide ion as a side chain of a core structure, in which the core structure may include at least one of polyfluorene, carbazole, and polyhexylthiophene, and the halide ion may include at least one of a bromine ion, an iodine ion, and a chlorine ion.

In one embodiment of the present inventive concept, the first polymer electrolyte layer may include a polymer electrolyte material represented in Formula 1 below.

[Formula 1]

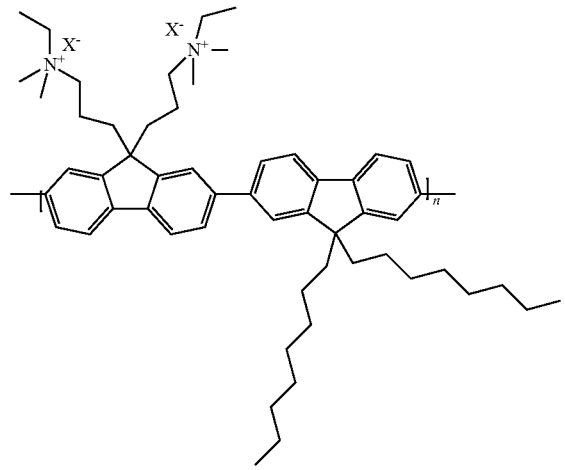

X = Halide ion (I⁻, Br⁻, Cl⁻)

In one embodiment of the present inventive concept, the second polymer electrolyte layer may include a polymer material represented by Formula 2 below,

[Formula 2]

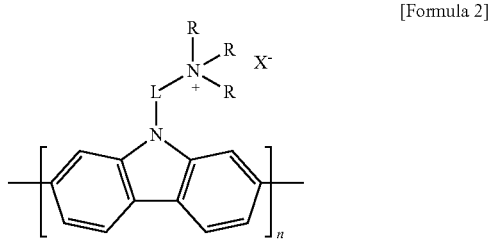

wherein n may be an integer in the range of 1 to 1000, L may be $C_1$ to $C_{30}$ alkyl, R may be hydrogen, halogen, or $C_1$ to $C_{10}$ alkyl, and X may be a halogen element.

In one embodiment of the present inventive concept, the second polymer electrolyte layer may be a polymer synthesized based on a carbazole having an amine group as a side chain, represented by Scheme 1 below.

In one embodiment of the present inventive concept, the first polymer electrolyte layer and the second polymer electrolyte layer may have a passivation function.

In one embodiment of the present inventive concept, in terms of thermal stability, when the perovskite solar cell is placed on a hot plate maintained at 85° C., even after 1,000 hours, its performance may be maintained at approximately 80% relative to the initial efficiency, and the performance may be maintained at 80% relative to the initial efficiency even after repeating 50 cycles of a process of increasing a temperature from a low temperature to a high temperature, such as −25° C. to 85° C., and then decreasing the temperature to the low temperature.

In one embodiment of the present inventive concept, in terms of photostability, when the perovskite solar cell is exposed to light and measured by a maximum power point tracking method, its performance may be maintained at 80% relative to the initial efficiency even after 350 hours.

In one embodiment of the present inventive concept, in terms of the stability against air, when the perovskite solar cell was stored while exposed to air, without exposure to sunlight, and the performance of the solar cell is measured

[Scheme 1]

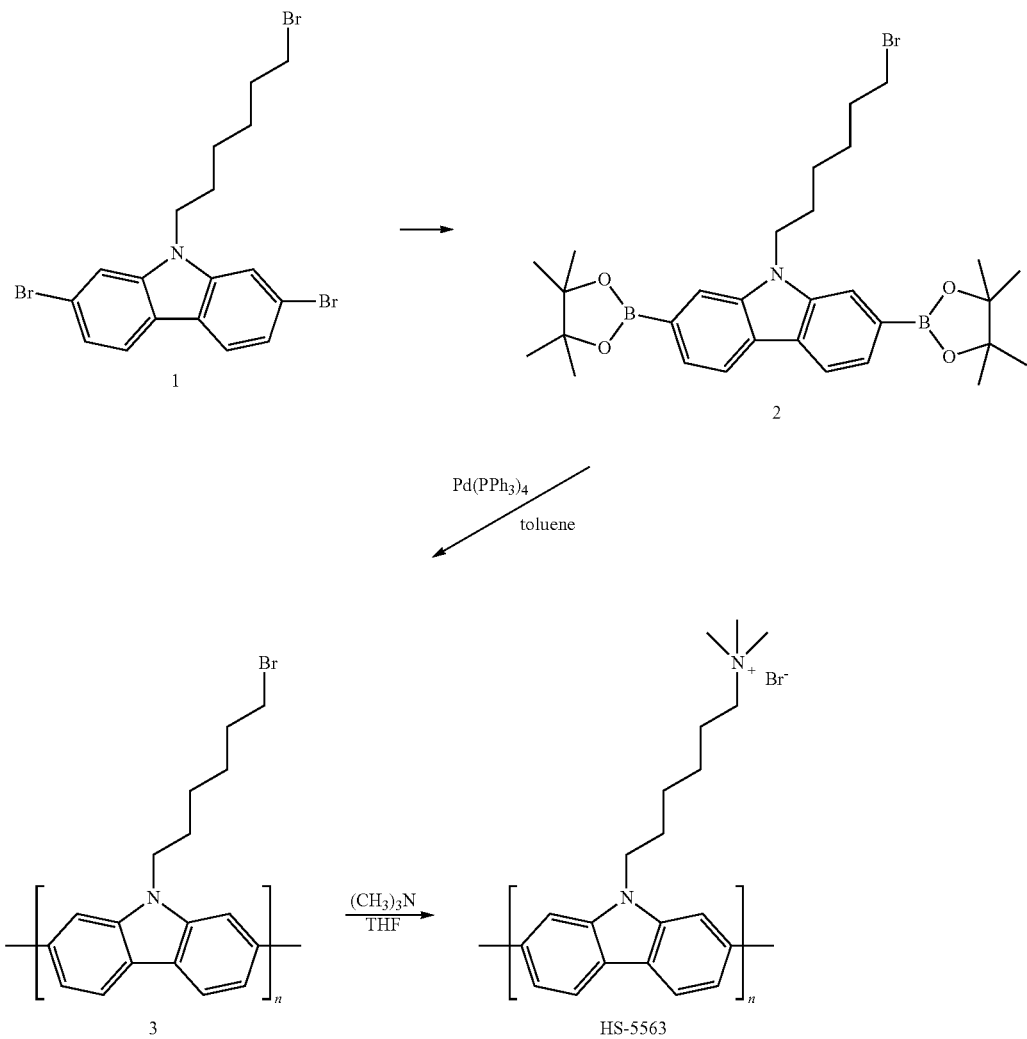

periodically, even after 1,500 hours, the performance of the solar cell may be maintained within 80% relative to the initial efficiency.

Another aspect of the present inventive concept provides a method of manufacturing a perovskite solar cell. The method of manufacturing a perovskite solar cell includes preparing a substrate on which a bottom electrode is formed; forming a hole transport layer on the bottom electrode; forming a first polymer electrolyte layer including a halide on the hole transport layer; forming a perovskite photoactive layer on the first polymer electrolyte layer; forming an electron transport layer on the perovskite photoactive layer; forming a second polymer electrolyte layer having an amine group on the electron transport layer; and forming an top electrode on the second polymer electrolyte layer.

In one embodiment of the present inventive concept, the preparing of a substrate on which a bottom electrode is formed may include washing a substrate having an ITO-containing electrode (ITO/glass substrate) sequentially with DI water, acetone, and IPA for 20 minutes each in an ultrasonic cleaner.

In one embodiment of the present inventive concept, the forming of a hole transport layer may include, after surface treatment of the washed ITO for 30 minutes using a UV-ozone apparatus, to form the hole transport layer, performing poly[bis(4-phenyl)(2,4,6-trimethylphenyl)amine] (PTAA) coating of the ITO/glass substrate with a solution in which PTAA is diluted in a toluene (Aldrich) solvent to 0.25 mg/mL by spin coating at 5000 rpm for 30 seconds.

In one embodiment of the present inventive concept, the forming of a first polymer electrolyte layer may include, to form the first polymer electrolyte layer, performing coating on the PTAA-coated ITO substrate in a solution state after a PFN-Br material is diluted in methanol (Aldrich) to 0.5 mg/mL at 5,000 rpm for 30 seconds.

In one embodiment of the present inventive concept, the forming of a perovskite photoactive layer may include forming a perovskite thin film using spin coating at 5,000 rpm for 30 seconds after applying a solution prepared by dissolving $PbI_2$ and MAI in (1.5 mol) dimethylformamide (DMF)/dimethyl sulfoxide (DMSO) (8:1) on a PTAA/PFN-Br thin film-coated substrate, and dripping a diethyl ether (DEE) solution 5 seconds after the initiation of spin coating during the spin coating of a perovskite solution to form crystals of the perovskite thin film; and after spin coating, drying the substrate on which the perovskite thin film is formed on a hot plate maintained at 100° C. for 10 minutes.

In one embodiment of the present inventive concept, the forming of an electron transport layer may include, to form an electron transport layer, coating the perovskite layer with a solution prepared by dissolving phenyl-C61-butyric-acid-methyl-ester (PCBM, 20 mg) in chlorobenzene (Aldrich) through spin coating at 2,000 rpm for 30 seconds.

In one embodiment of the present inventive concept, the forming of a second polymer electrolyte layer may include 1) synthesizing a carbazole-based polymer compound having an amine group; and 2) synthesizing 2,7-(9H-carbazole-9-yl)-N,N,N-trimethylhexane-1-bromide (HS-5563).

In one embodiment of the present inventive concept, the synthesizing of a carbazole-based polymer compound having an amine group may include obtaining poly(9-(6-bromohexyl)-9H-carbazole) through a Suzuki polymerization reaction while stirring at 100° C. for 2 hours in a microwave reactor after dissolving compounds, such as 2,7-dibromo-9-(6-bromohexyl)-9H-carbazole (0.1 g, 0.2049 mmol), 9-(6-bromohexyl)-2,7-bis(4,4,5,5-tetramethyl-1,3,2-dioxyborolan-2-yl)-9H-carbazole (0.1193 g, 0.2049 mmol), and tetraethylammonium hydroxide (1 mL) in toluene (4 mL) and adding tetrakis(triphenylphosphine)palladium (0) at a catalytic amount.

In one embodiment of the present inventive concept, the synthesizing of 2,7-(9H-carbazole-9-yl)-N,N,N-trimethylhexane-1-bromide (HS-5563) may include obtaining a yellow oil (0.2 g, 30%) by dissolving poly(9-(6-bromohexyl)-9H-carbazole (Formula 3) (0.26 g) in tetrahydrofuran (30 mL), adding trimethylamine (5 mL) at 0° C. to the reaction mixture and stirring the resulting mixture at room temperature in the presence of argon gas for 48 hours, washing the resulting reaction mixture three times with chloroform, and performing vacuum distillation.

In one embodiment of the present inventive concept, a second polymer electrolyte layer may be formed by coating the electron transport layer with a solution in which the synthesized HS-5563 material is diluted in methanol to 0.05 wt % on the electron transport layer at 5,000 rpm for 30 seconds.

Advantageous Effects

According to embodiments of the present inventive concept, a perovskite solar cell with high storage stability against heat, light, and air can be provided by preventing the elution of halide ions from a perovskite layer due to passivation layers disposed in the upper and lower sides of the perovskite layer.

According to embodiments of the present inventive concept, a method of synthesizing a carbazole polymer electrolyte with an amine group for a high-stability inverted perovskite solar cell and manufacturing a solar cell device using the same can be provided.

The present inventive concept using a polymer electrolyte layer enabling a solution process can use the optical/electrical properties of an existing inverted perovskite solar cell, and further increase efficiency, for example, an increase in open-circuit voltage or photocurrent, as well as increasing stability, by simply introducing polymer electrolyte layers onto an electron transport layer and a hole transport layer, which are disposed in the upper and lower parts.

In addition, since based on the processability of the polymer electrolyte layer enabling a solution process, when the perovskite solar cell is applied to a device using a flexible substrate, a positive effect on enhancing stability of perovskite solar cell can be expected, which presents a breakthrough that can improve the stability problem of the device using a flexible substrate and provides an opportunity for the perovskite solar cell device to be used as a next-generation energy source.

MODES OF THE INVENTIVE CONCEPT

Figure 1:
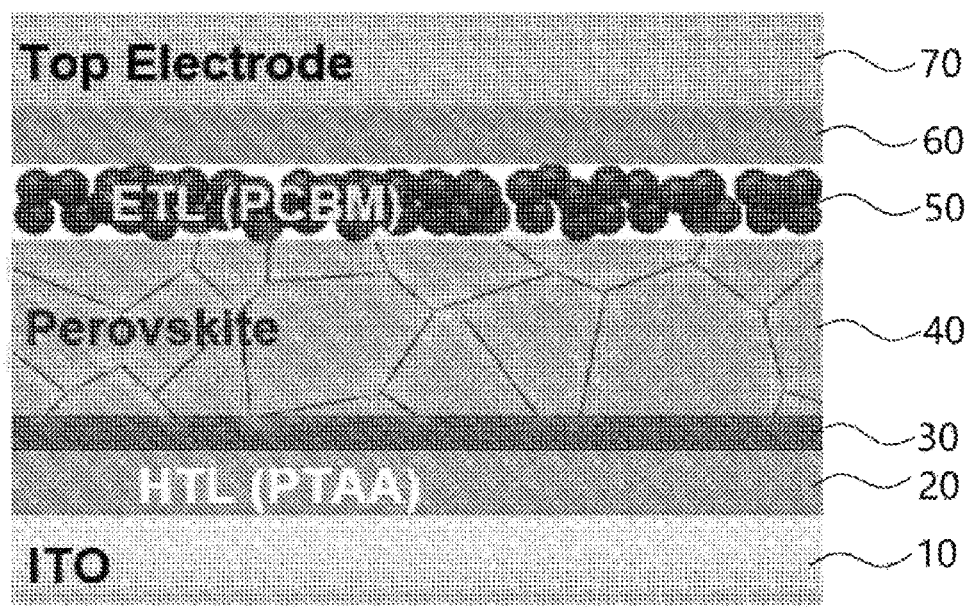
FIG. 1 is a diagram showing a perovskite solar cell according to one embodiment of the present inventive concept.

The present inventive concept may have various modifications and various examples, and thus specific examples are illustrated in the drawings and described in detail in the detailed description. However, it should be understood that the present inventive concept is not limited to specific embodiments, and includes all modifications, equivalents or alternatives within the spirit and technical scope of the present inventive concept. Like numerals have been used to denote like elements to describe each drawing.

All terms including technical and scientific terms have the same meaning that is generally understood by those skilled in the art unless defined otherwise. General terms, such as terms defined in dictionaries, should be interpreted with meanings according to the context of the related art, and should not be interpreted with ideal or excessively formal meanings unless clearly defined herein.

Hereinafter, preferred embodiments of the present inventive concept will be described in further detail with reference to the accompanying drawings.

FIG. 1 is a diagram showing a perovskite solar cell according to one embodiment of the present inventive concept.

The perovskite solar cell includes a bottom electrode 10, a hole transport layer 20, a first polymer electrolyte layer 30, a perovskite photoactive layer 40, an electron transport layer 50, a second polymer electrolyte layer 60, and a top electrode 70.

The bottom electrode may be formed on a substrate. The substrate may be a glass substrate, and as the bottom electrode, ITO may be used. Alternatively, the substrate may be in the form of a sheet formed of a flexible material.

The hole transport layer may be formed on the bottom electrode. In one example, the hole transport layer may include poly(3,4-ethylenedioxythiophene):polystyrene sulfonate (PEDOT:PSS) as a p-type semiconductor.

The first polymer electrolyte layer may be formed on the hole transport layer, and may consist of a halide-containing material. The first polymer electrolyte layer will be further described below.

The perovskite photoactive layer may be formed on the first polymer electrolyte layer. As the perovskite photoactive layer, formamidinium lead bromide (FAPbBr$_3$), formamidinium lead bromine chloride (FAPbBr$_2$Cl), or methylammonium lead iodide (MAPbI$_3$) may be used, but the present inventive concept is not limited thereto.

The electron transport layer may be formed on the perovskite photoactive layer. The electron transport layer may include a C60 derivative, or [6,6]-phenyl-C61-butyric acid methyl ester (PCBM) as an n-type semiconductor.

The second polymer electrolyte layer may be formed on the electron transport layer and may consist of a material having an amine group. The second polymer electrolyte layer will be described below.

The top electrode may be formed on the second polymer electrolyte layer.

The first polymer electrolyte layer and the second polymer electrolyte layer may have a passivation function, and may prevent the elution of halide ions. Accordingly, a perovskite solar cell having high storage stability against heat, light, and air may be provided.

The perovskite solar cell of the present embodiment may be applied to a structure in which polymer electrolyte layers are introduced above and below the perovskite layer to address the decreased performance of a device, found in exposure to heat, air and light, which had been problematic in the inverted perovskite solar cell.

Unlike the present embodiment, of course, a device whose top and bottom are inverted is also included in the present inventive concept. That is, a structure in which an electrode is formed on a substrate, and a second polymer electrolyte layer, an electron transport layer, a perovskite photoactive layer, a first polymer electrolyte layer, a hole transport layer, and ITO are stacked on the electrode is naturally included in the scope of the present inventive concept.

In addition, the perovskite material may be suitably selected according to the type of device. That is, the perovskite material may be selected according to necessity, such as a solar cell, a light emitting device, etc. Although description is centered on a solar cell in the present embodiment, the present inventive concept may be applied to not only a solar cell but also a light emitting device or an optical device to which another perovskite material is applied.

Hereinafter, the perovskite solar cell of the present embodiment will be described in detail.

A polymer included in a lower passivation layer, that is, the first polymer electrolyte layer, may include halide ions as a side chain in the core structure, wherein the core structure may include at least one of polyfluorene, carbazole, and polyhexylthiophene, and the halide ions may include at least one of bromine ions, iodine ions and chlorine ions.

For example, a polymer electrolyte material represented by Formula 1 below may be used for the first polymer electrolyte layer.

[Formula 1]

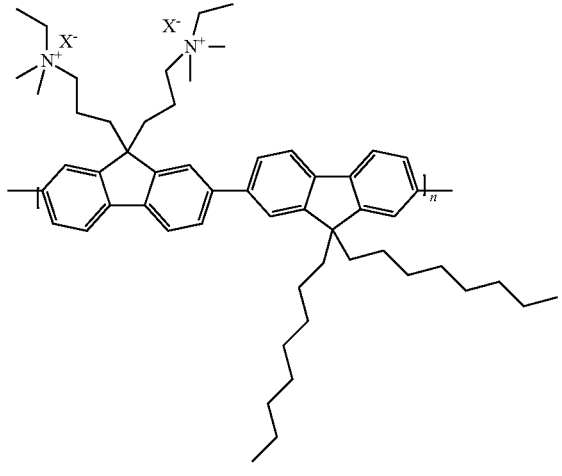

X = Halide ion (I⁻, Br⁻, Cl⁻)

That is, a polyfluorene-based electrolyte functional layer (first polymer functional layer) may be interposed between the p-type functional layer (hole transport layer) and the perovskite photoactive layer. A polyfluorene-based electrolyte is a material with a high bandgap, which includes a bromine group and is transparent to a visible light region. The p-type functional layer may be formed on the bottom electrode.

Formula 1 shows a structure which is based on a polyfluorene structure and includes halide ions in a side chain. Typically, bromine ions may be used, and iodide ions or chloride ions may be used. Since the material of Formula 1 uses polyfluorene with a high bandgap, it has a high bandgap that is transparent to the visible light region. As described above, the first polymer electrolyte layer is not limited to polyfluorene as the core structure, and may be replaced with carbazole or polyhexylthiophene, which can be synthesized into a polymer electrolyte.

The second polymer electrolyte layer may include a polymer represented by Formula 2 below.

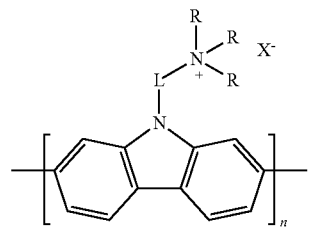

[Formula 2]

Here, n is an integer in the range of 1 to 1,000, L may be $C_1$ to $C_{30}$ alkyl, R may be hydrogen, halogen, or $C_1$ to $C_{10}$ alkyl, and X may be a halogen element.

Such a second polymer electrolyte layer may include a polymer synthesized based on a carbazole having an amine group as a side chain, represented by Scheme 1 below.

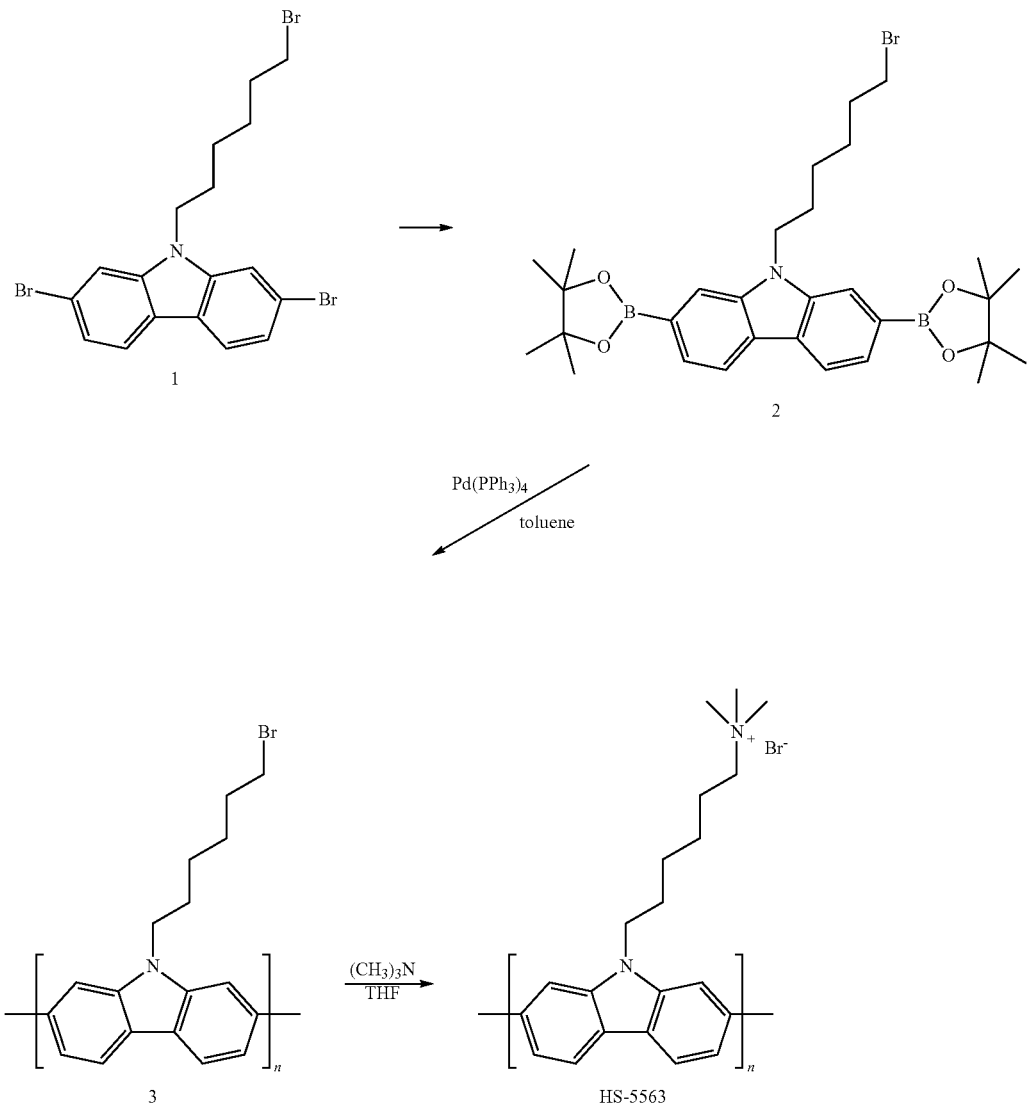

[Scheme 1]

That is, the carbazole polymer-based electrolyte functional layer (second polymer electrolyte layer) may be interposed between the top electrode and the n-type functional layer (electron transport layer). A carbazole polymer is a material with excellent thermal stability, which has an amine group in a side chain. The n-type functional layer may be formed on the perovskite photoactive layer.

The first polymer electrolyte layer and the second polymer electrolyte may be formed as an ultra-thin film of 10 nm or less.

The inverted perovskite solar cell may have improved stability against heat, air and light, compared to conventional ones.

For the inverted solar cell with high stability against heat, air and light, the present inventors invented and discovered, particularly, a structural feature in which a polymer electrolyte is introduced to the upper and lower parts, a method of synthesizing an organic polymer electrolyte compound having an amine group for a polymer electrolyte compound functional layer introduced between the n-type functional layer and the top electrode, and a material that can be used as an organic polymer electrolyte having a bromine group, introduced between the p-type functional layer and the perovskite photoactive layer, and the present inventive concept was completed.

Figure 2:
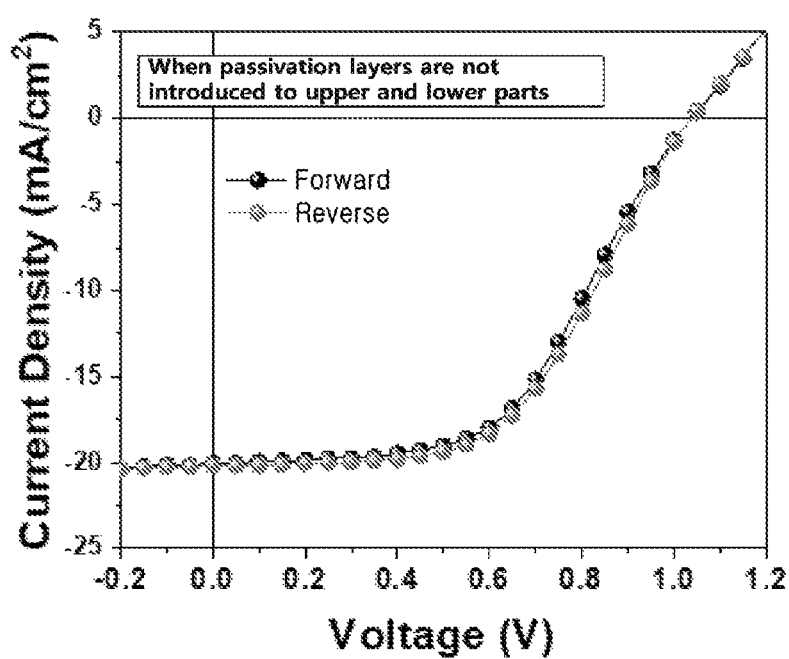
FIG. 2 is a diagram showing a current-voltage curve for a perovskite solar cell of Comparative Example 1.
Figure 3:
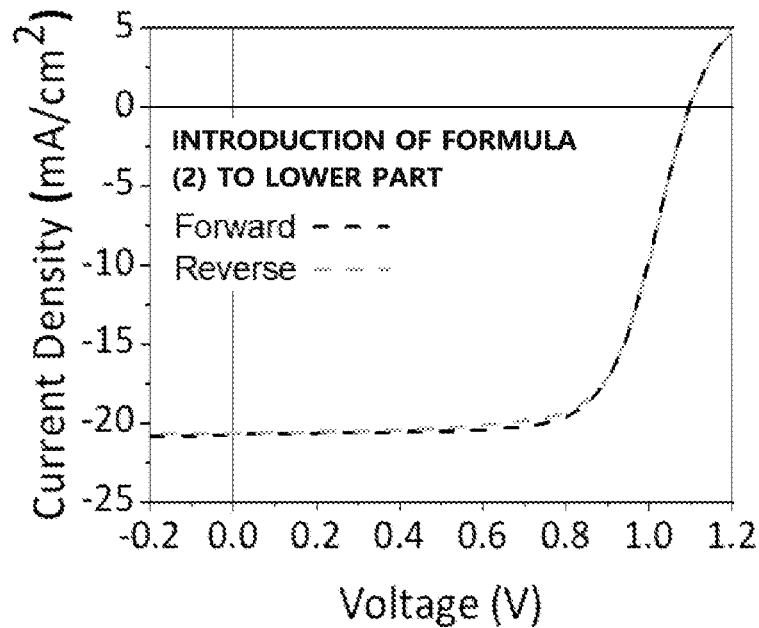
FIG. 3 is a diagram showing a current-voltage curve for a perovskite solar cell of Comparative Example 2.
Figure 4:
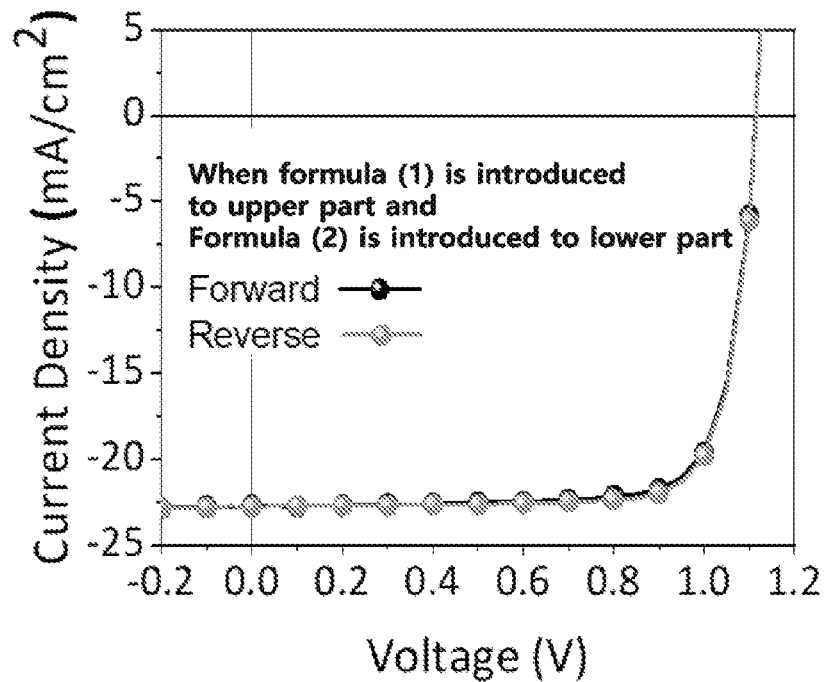
FIG. 4 is a diagram showing a current-voltage curve for a perovskite solar cell according to one embodiment of the present inventive concept.

FIG. 2 is a diagram showing a current-voltage curve for a perovskite solar cell of Comparative Example 1. FIG. 3 is a diagram showing a current-voltage curve for a perovskite solar cell of Comparative Example 2. FIG. 4 is a diagram showing a current-voltage curve for a perovskite solar cell according to one embodiment of the present inventive concept.

FIG. 2 shows a current-voltage curve for a perovskite solar cell in which passivation functional layers are not introduced above and below the perovskite layer. FIG. 3 shows a current-voltage curve for a perovskite solar cell in which the passivation functional layer represented by Formula 1 is introduced below the perovskite layer.

Referring to FIGS. 2 to 4, the inverted perovskite solar cells in which polymer electrolyte passivation functional layers are not introduced to the upper and lower parts exhibit a low photocurrent, open-circuit voltage, and solar cell charging rate.

On the other hand, when the above-described lower polymer electrolyte passivation functional layer (first polymer electrolyte layer) was introduced, it can be seen that each solar cell constant was relatively improved.

In addition, when the first and second polymer electrolyte layers of the present embodiment were introduced, it can be seen that a higher open-circuit voltage and solar cell charging rate are shown, compared to Comparative Examples 1 and 2.

Figure 5:
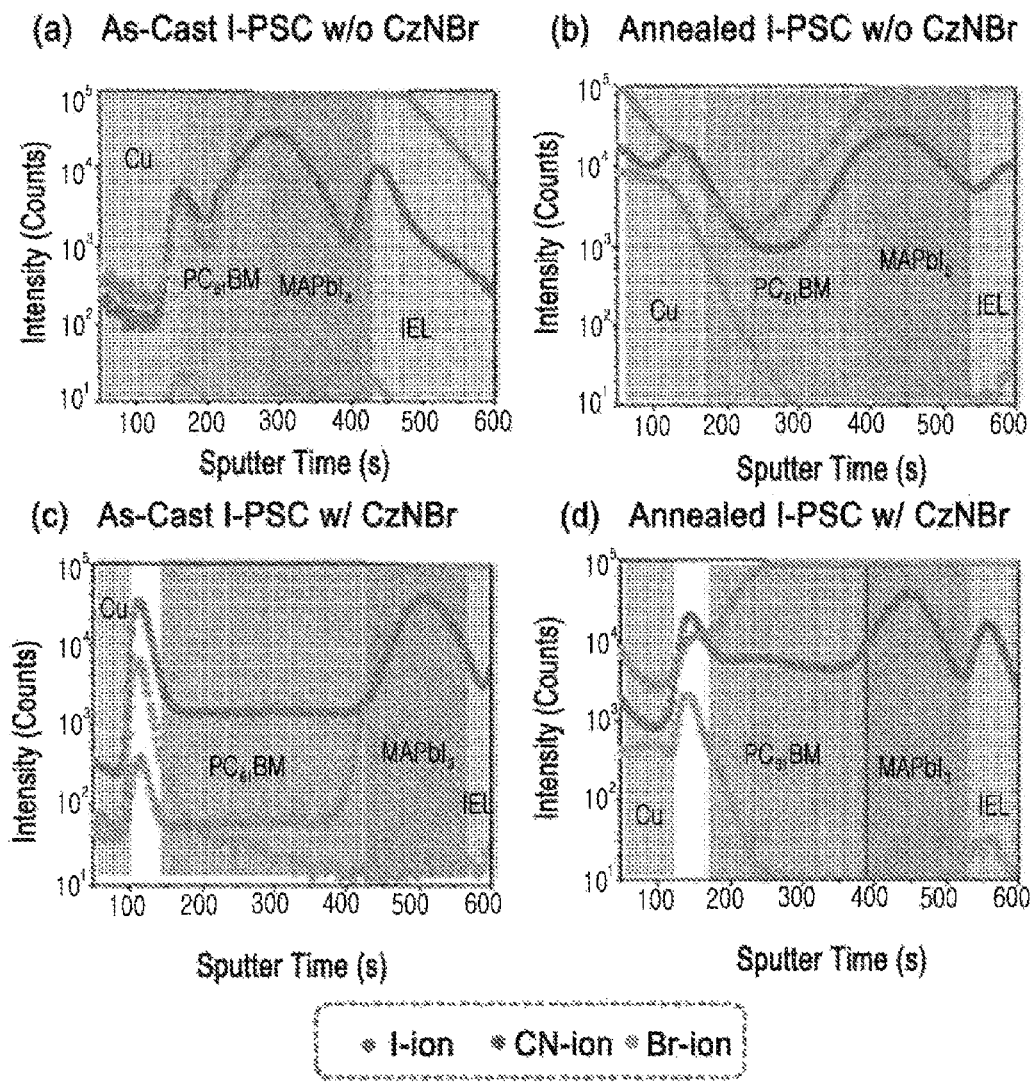
FIG. 5 is a diagram showing the change in ion distribution in the perovskite layer of a perovskite solar cell according to one embodiment of the present inventive concept.

FIG. 5 is a diagram showing the change in ion distribution in the perovskite layer of a perovskite solar cell according to one embodiment of the present inventive concept.

Referring to FIG. 5, according to the introduction of the upper and lower passivation functional layers, that is, the first polymer electrolyte layer and the second polymer electrolyte layer, in the present embodiment, it can be confirmed that the penetration of an iodide component of the perovskite photoactive layer toward the electrode is reduced. In addition, it can be confirmed that halide ions (e.g., Br) of the lower functional layer (first polymer electrolyte layer) penetrate into the perovskite photoactive layer. This means that, through the introduction of the second polymer electrolyte layer and the first polymer electrolyte layer in the form of an ultra-thin film of approximately 10 nm to the upper and lower parts, in the upper part, an iodide component released from the perovskite photoactive layer encounters the top electrode to prevent immediate oxidation, and the bromide component of the first polymer electrolyte layer penetrates into an empty part created by the release of the iodide component of the perovskite layer, allowing the perovskite photoactive layer to maintain a stable structure, thereby increasing perovskite stability.

Figure 6:
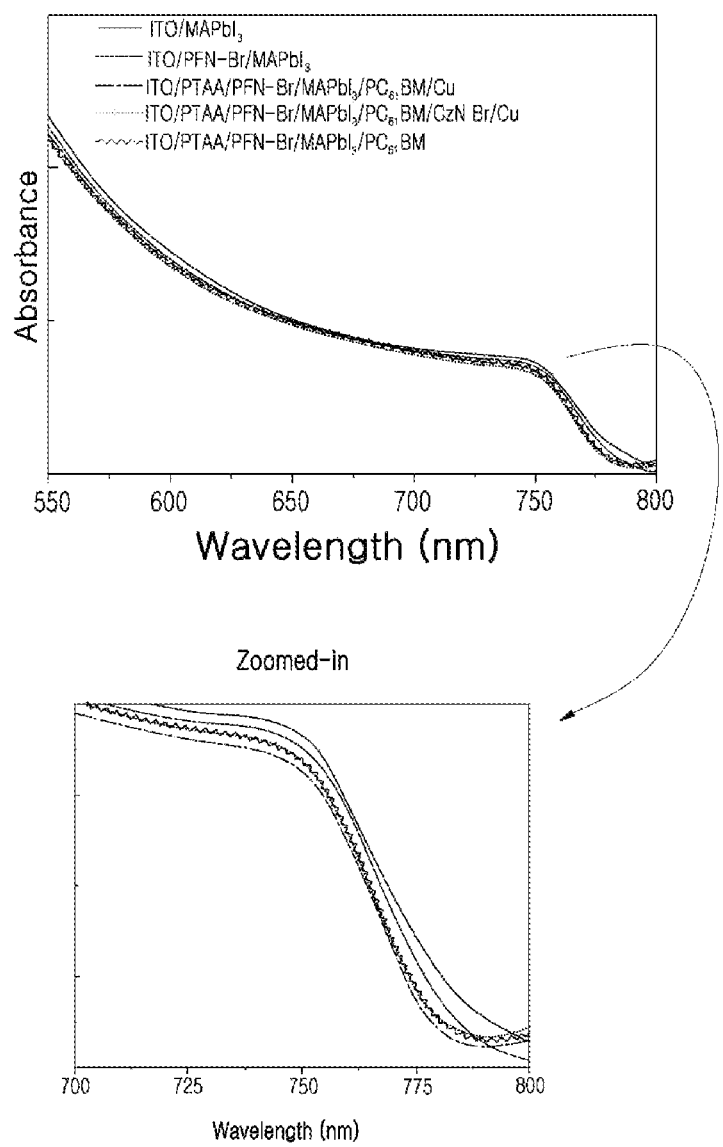
FIG. 6 is a diagram showing the change in perovskite bandgap according to bromine ion penetration into a lower portion of the perovskite layer of a perovskite solar cell according to one embodiment of the present inventive concept.

FIG. 6 is a diagram showing the change in perovskite bandgap according to bromine ion penetration into a lower portion of the perovskite layer of a perovskite solar cell according to one embodiment of the present inventive concept.

Referring to FIG. 6, it can be confirmed that bromine ions penetrating into the perovskite photoactive layer from the lower passivation functional layer (first polymer electrolyte layer) change the composition of perovskite to change the bandgap of the perovskite photoactive layer. From the bandgap change, it can be seen that the perovskite composition changes from $MAPbI_3$ to $MAPbI_{3-x}Br_x$, and it can be presumed that the perovskite ratio has changed to a more stable structure.

As described in FIGS. 4 and 5, according to the introduction of the upper and lower passivation functional layers (first polymer electrolyte layer and second polymer electrolyte layer), it can be seen that a perovskite thin film with greatly increased stability is formed. That is, through the simple introduction of functional layers (first polymer electrolyte layer and second polymer electrolyte layer) without the modification of a perovskite photoactive layer, the stability of the perovskite photoactive layer increased.

Figure 7:
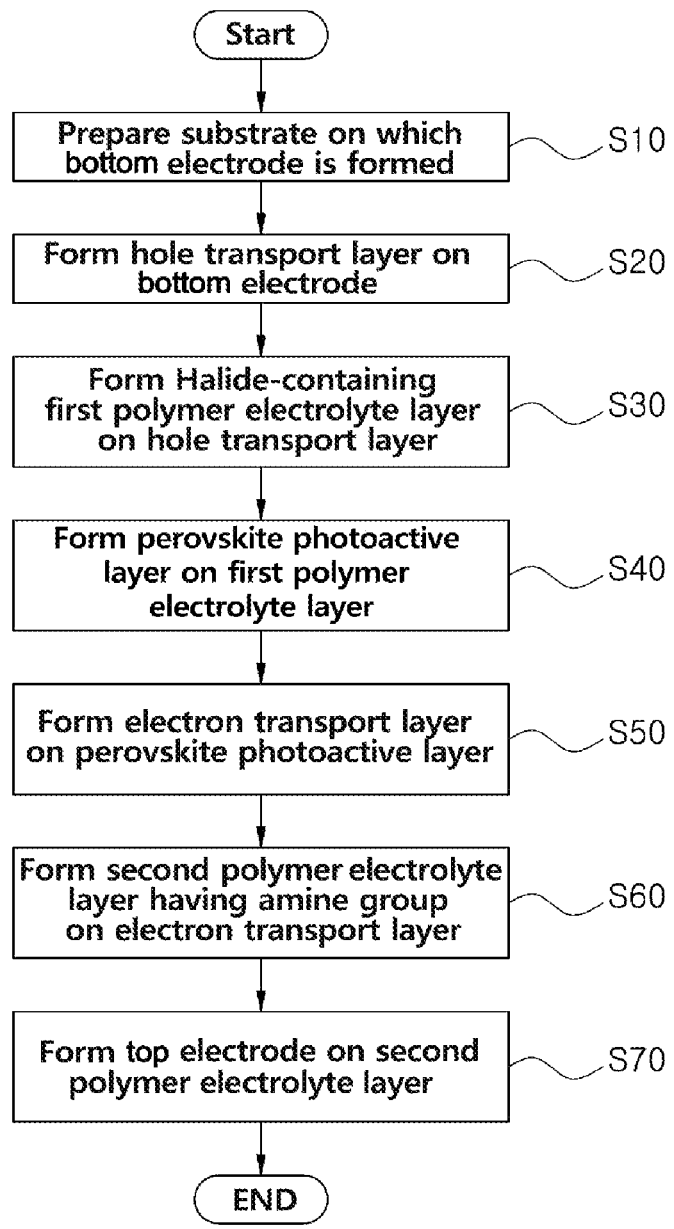
FIG. 7 is a flow chart illustrating a method of manufacturing a perovskite solar cell according to one embodiment of the present inventive concept.

FIG. 7 is a flow chart illustrating a method of manufacturing a perovskite solar cell according to one embodiment of the present inventive concept.

In the method of manufacturing a perovskite solar cell, first, a substrate on which a bottom electrode is formed is prepared (S10). For example, a process of forming a bottom electrode is performed on a substrate, or a substrate on which a bottom electrode is formed is prepared. For example, in the case of the perovskite solar cell shown in FIG. 1, a bottom electrode may be formed of ITO on a glass substrate.

Afterward, a hole transport layer is formed on the bottom electrode (S20). The hole transport layer may be formed to include poly(3,4-ethylenedioxythiophene):polystyrene sulfonate (PEDOT:PSS) as a p-type semiconductor.

Subsequently, a first polymer electrolyte layer containing a halide is formed on the hole transport layer (S30). The first polymer electrolyte layer may be formed of the above-described polymer electrolyte represented by Formula 1.

Next, a perovskite photoactive layer is formed on the first polymer electrolyte layer (S40). A perovskite material may have excellent optoelectronic properties (e.g., a high extinction coefficient, small exciton-binding energy, a long exciton diffusion length, and optical gap adjustability). The perovskite material of the present embodiment is an organic-inorganic perovskite (OIP) material, and may have a composition or structure for enhancing a photoelectronic conversion operation, rather than a light emission operation. The perovskite material is not limited thereto, and as described above, it may be suitably selected according to the type of device.

Thereafter, an electron transport layer is formed on the perovskite photoactive layer (S50). The electron transport layer may include [6,6]-phenyl-C61-butyric acid methyl ester (PCBM) as an n-type semiconductor.

Afterward, a second polymer electrolyte layer having an amine group is formed on the electron transport layer (S60). The second polymer electrolyte layer may be formed using the above-described material represented by Formula 2.

A top electrode is the formed on the second polymer electrolyte layer (S70). The top electrode may consist of a metal such as copper.

EXAMPLES

Hereinafter, specific examples are as follows.

Example 1

In the step of preparing a substrate on which a bottom electrode is formed, a substrate including an ITO-containing electrode (ITO/glass substrate) was washed sequentially with DI water, acetone and IPA for 20 minutes each in an ultrasonic cleaner.

Subsequently, after surface treatment of the washed ITO for 30 minutes using a UV-ozone apparatus, to form a hole transport layer, PTAA coating of the substrate was performed by spin coating on the ITO/glass substrate with a solution in which poly[bis(4-phenyl)(2,5,6-trimethylphenyl) amine (PTAA; hole transport layer) was diluted in a toluene (Aldrich) solvent at 0.25 mg/mL at 5,000 rpm for 30 seconds.

Subsequently, to form a first polymer electrolyte layer, in a solution state after diluting a PFN-Br material in methanol (Aldrich) to 0.5 mg/mL, coating was performed on the PTAA-coated ITO substrate at 5,000 rpm for 30 seconds.

Afterward, to form a perovskite photoactive layer, a perovskite thin film was formed by applying a solution in which $PbI_2$ and MAI were dissolved in (1.5 mol) dimethylformamide (DMF)/dimethyl sulfoxide (DMSO) (8:1) onto the PTAA/PFN-Br thin film-coated substrate and performing spin coating at 5,000 rpm for 30 seconds. To form crystals of the perovskite thin film, during the spin coating with the perovskite solution, a process of dripping a diethyl ether (DEE) solution 5 seconds after the initiation of the spin coating was carried out. After spin coating, the substrate on which the perovskite thin film was formed was subjected to a drying process on a hot plate maintained at 100° C. for 10 minutes.

Subsequently, to form an electron transport layer, a solution in which phenyl-$C_{61}$-butyric-acid-methyl-ester (PCBM, 20 mg) was dissolved in chlorobenzene (Aldrich) was applied onto the perovskite layer by spin coating at 2,000 rpm for 30 seconds.

Next, to form a second polymer electrolyte layer, 1) a process of synthesizing a carbazole-based polymer compound having an amine group, and 2) a process of synthesizing 2,7-(9H-carbazole-9-yl)-N,N,N-trimethylhexane-1-bromide (HS-5563) were performed.

As a process of synthesizing a carbazole-based polymer compound having an amine group, poly(9-(6-bromohexyl)-9H-carbazole was obtained through a Suzuki polymerization reaction by dissolving compounds 2,7-dibromo-9-(6-bromohexyl)-9H-carbazole (0.1 g, 0.2049 mmol), 9-(6-bromohexyl)-2,7-bis(4,4,5,5-tetramethyl-1,3,2-dioxybororan-2-yl)-9H-carbazole (0.1193 g, 0.2049 mmol), and tetraethylammonium hydroxide (1 mL) in toluene (4 mL), adding tetrakis(triphenylphosphine)palladium (0) at a catalytic amount, and stirring the resulting mixture in a microwave reactor at 100° C. for 2 hours.

As a process of synthesizing 2,7-(9H-carbazole-9-yl)-N,N,N-trimethylhexane-1-bromide (HS-5563), poly(9-(6-bromohexyl)-9H-carbazole (Formula 3) (0.26 g) was dissolved in tetrahydrofuran (30 mL), trimethylamine (5 mL) was added to the reaction mixture at 0° C., and then the resulting mixture was stirred at room temperature in the presence of argon gas for 48 hours, washed with chloroform three times, and subjected to vacuum distillation, thereby obtaining a yellow oil (0.2 g, 30%).

Subsequently, a solution in which the synthesized HS-5563 material was diluted in methanol to 0.05 wt % was applied onto the electron transport layer by spin coating at 5,000 rpm for 30 seconds, thereby obtaining a second polymer electrolyte layer.

Finally, to form a top electrode, a metal electrode (copper) was formed to a thickness of 100 nm using vacuum deposition.

As above, in Example 1, as the upper passivation functional layer, that is, the second polymer electrolyte layer, polymer materials represented by the following formulas may be used.

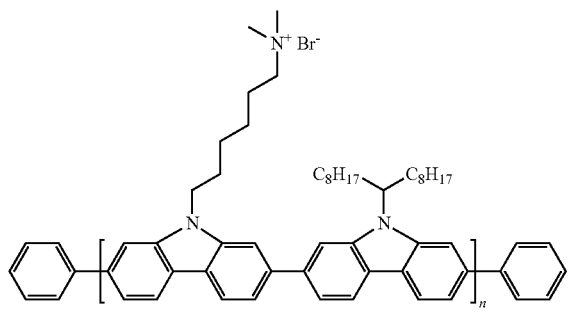

HS-5562

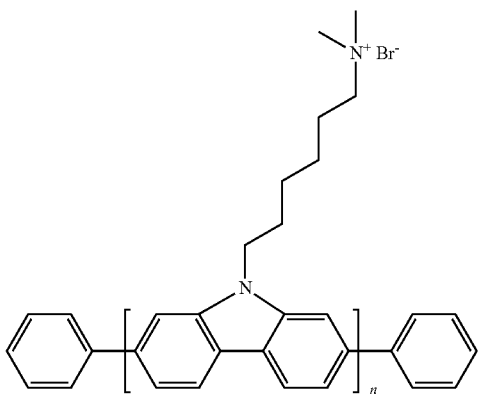

HS-5563

HS-5564
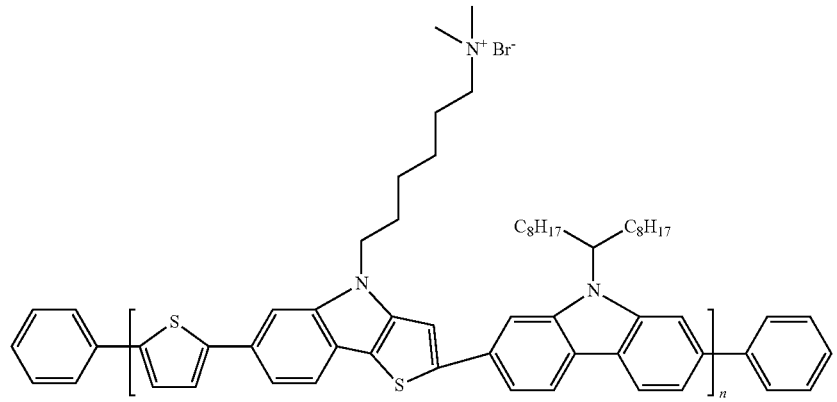
HS-5565
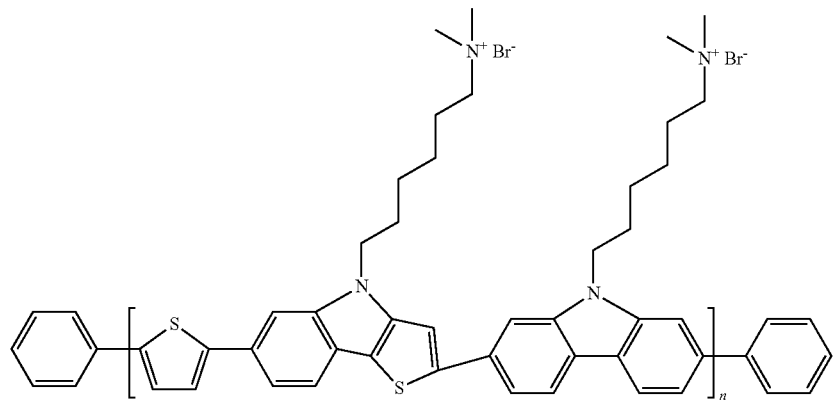
In Example 1, as the lower passivation functional layer, that is, the first polymer electrolyte layer, polymer materials represented by the following formulas may be used.
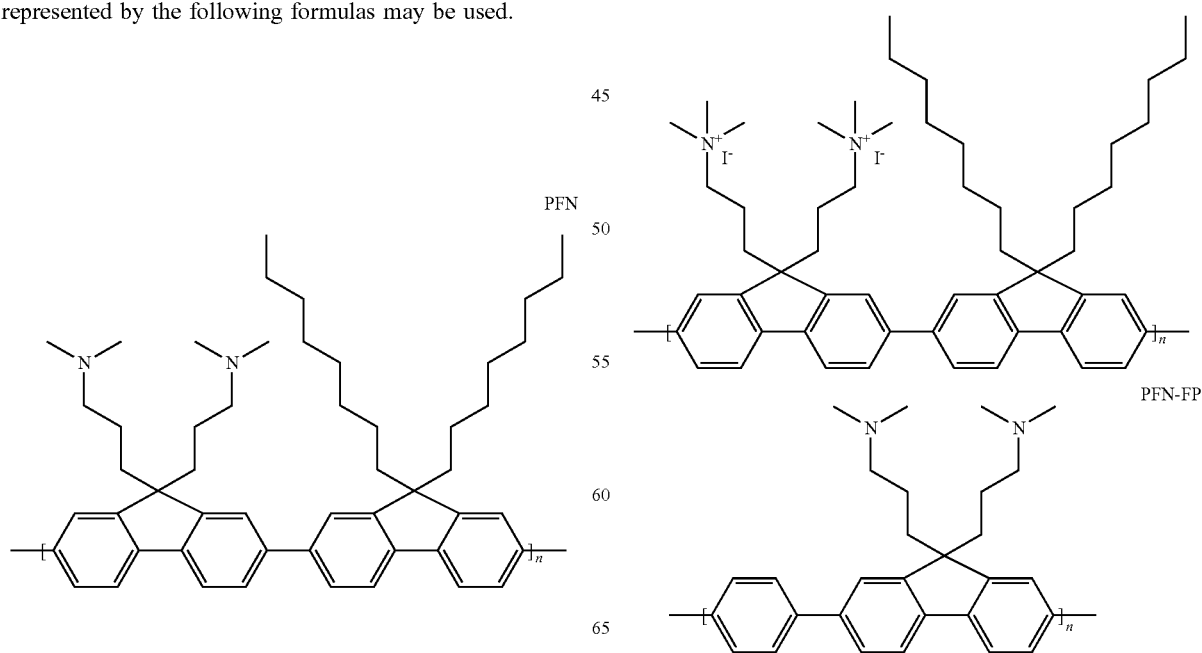

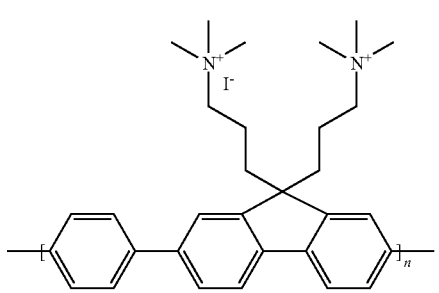

PFN-FP-1

Figure 8:
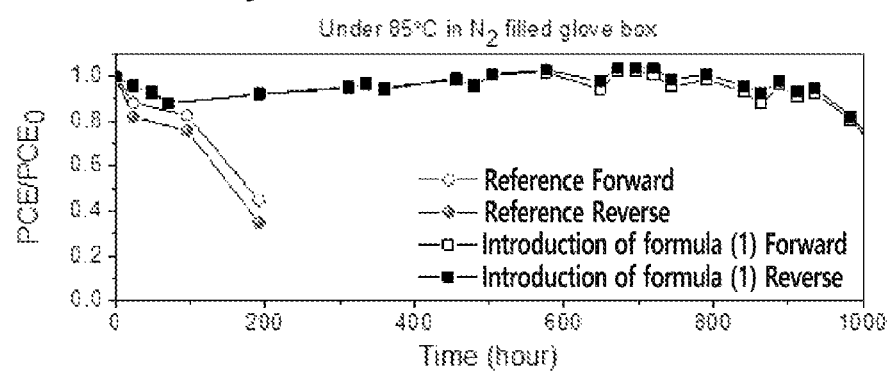
FIG. 8 is a diagram showing the experimental results for the thermal stability of a perovskite solar cell according to one embodiment of the present inventive concept.

FIG. 8 is a diagram showing the experimental results for the thermal stability of a perovskite solar cell according to one embodiment of the present inventive concept.

Referring to FIG. 8, in terms of thermal stability, when the perovskite solar cell according to one embodiment of the present inventive concept was placed on a hot plate maintained at 85° C., it can be confirmed that its performance is maintained at 80% relative to the initial efficiency even after 1,000 hours. In addition, it can be confirmed that the performance of the perovskite solar cell is maintained at 80% relative to the initial efficiency even after repeating 50 cycles of a process of increasing a temperature from a low temperature to a high temperature, such as −25° C. to 85° C., and then decreasing the temperature to the low temperature.

Accordingly, compared to the conventional comparative example (reference) shown in FIG. 8, it can be seen that thermal stability is significantly improved.

Figure 9:
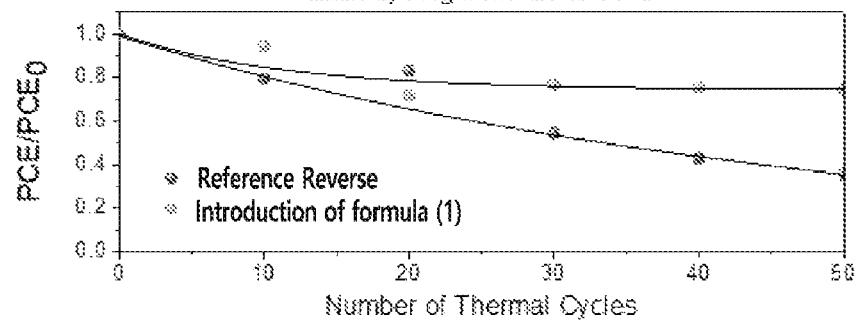
FIG. 9 is a diagram showing the experimental results for the temperature cycling of a perovskite solar cell according to one embodiment of the present inventive concept.

FIG. 9 is a diagram showing the experimental results for the temperature cycling of a perovskite solar cell according to one embodiment of the present inventive concept.

In terms of thermal stability, it can be confirmed that the performance of the perovskite solar cell of the present embodiment is maintained at 80% relative to the initial efficiency even after repeating 50 cycles of a process of increasing the temperature from −25° C. to 85° C. and then decreasing the temperature to the low temperature.

Accordingly, compared to the conventional comparative example (reference) shown in FIG. 9, it can be seen that a temperature cycling characteristic is significantly improved.

Figure 10:
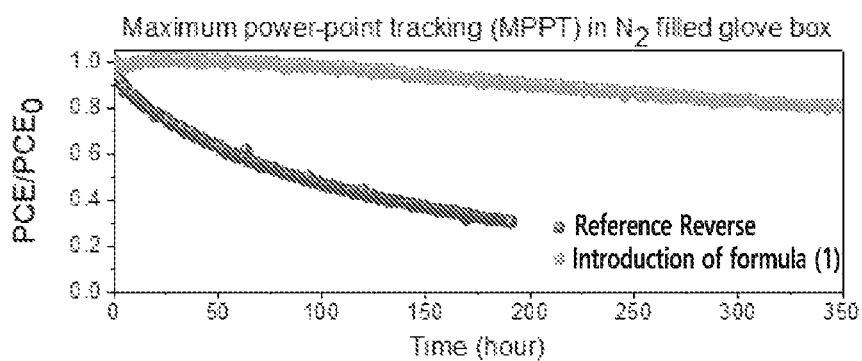
FIG. 10 is a diagram showing the experimental results for the photostability of a perovskite solar cell according to one embodiment of the present inventive concept.

FIG. 10 is a diagram showing the experimental results for the photostability of a perovskite solar cell according to one embodiment of the present inventive concept.

In terms of photostability, when the perovskite solar cell of the present embodiment is exposed to light and measured by a maximum power point tracking method, it can be confirmed that the performance of the solar cell is maintained at 80% relative to the initial efficiency even after 350 hours.

Accordingly, compared to the conventional comparative example (reference) shown in FIG. 10, it can be confirmed that photostability is significantly improved.

Figure 11:
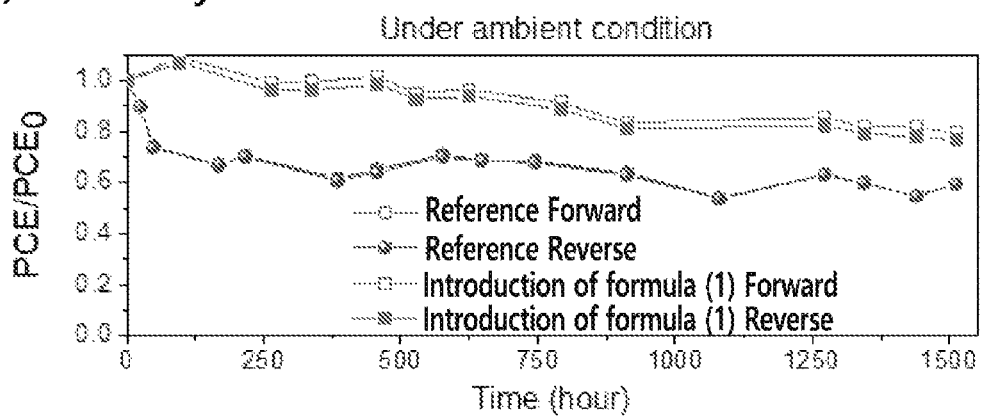
FIG. 11 is a diagram showing the experimental results for the air stability of a perovskite solar cell according to one embodiment of the present inventive concept.

FIG. 11 is a diagram showing the experimental results for the air stability of a perovskite solar cell according to one embodiment of the present inventive concept.

In terms of stability against air, when the perovskite solar cell of the present embodiment is stored while exposed to air, without exposure to sunlight, and its performance is measured periodically, it can be confirmed that the performance of the solar cell is maintained at 80% relative to the initial efficiency even after 1,500 hours.

Accordingly, compared to the conventional comparative example (reference) shown in FIG. 11, it can be confirmed that air stability is significantly improved.

In organic-inorganic hybrid perovskite solar cells, when exposed to heat and light, ionic defects in the perovskite layer move upward, destroying the electrode and the n-type functional layer.

At the same time, the site where the ionic defects move upward induces defects in perovskite crystals, inhibiting the stability of the perovskite layer.

Therefore, a problem of deteriorating the performance of the perovskite solar cell when exposed to heat and light occurs. When the perovskite solar cell is exposed to air, air penetrates into the n-type functional layer and reacts with the perovskite layer, causing a problem of reducing the efficiency of the device. Accordingly, when exposed to heat and light, the present inventive concept can ensure high storage stability against heat, light, and air by introducing the polymer electrolyte functional layer having an amine group at the top to prevent the destruction of the electrode and the n-type functional layer due to ionic defects in the perovskite layer moving upward and also prevent the reaction of air at the top, and introducing the polymer electrolyte layer having a bromine group under the perovskite layer to prevent the instability of perovskite crystals, occurring due to the removal of the ionic defects.

The above-described description of the present inventive concept is merely provided to exemplify the present inventive concept, and it will be understood by those of ordinary skill in the art to which the present inventive concept belongs that the present inventive concept can be implemented in modified forms without departing from the essential features of the present inventive concept. Therefore, the exemplary embodiments described above should be interpreted as illustrative and not limited in any aspect. For example, each component described as a single unit may be implemented in a distributed manner, and components described as being distributed may also be implemented in combined form.

The scope of the present inventive concept is defined by the appended claims and encompasses all modifications and alterations derived from meanings, the scope and equivalents of the appended claims.

EXPLANATION OF REFERENCE NUMERALS bottom electrode 10, hole transport layer 20, first polymer electrolyte layer 30, perovskite photoactive layer 40, electron transport layer 50, second polymer electrolyte layer 60, and top electrode 70

The invention claimed is:

1. A perovskite solar cell, comprising:
a bottom electrode;
a hole transport layer formed on the bottom electrode;
a first polymer electrolyte layer formed on the hole transport layer and including a halide;
a perovskite photoactive layer formed on the first polymer electrolyte layer;
an electron transport layer formed on the perovskite photoactive layer;
a second polymer electrolyte layer formed on the electron transport layer and including an amine group; and
a top electrode formed on the second polymer electrolyte layer,
wherein the second polymer electrolyte layer comprises a polymer represented by Formula 2 below,

[Formula 2]

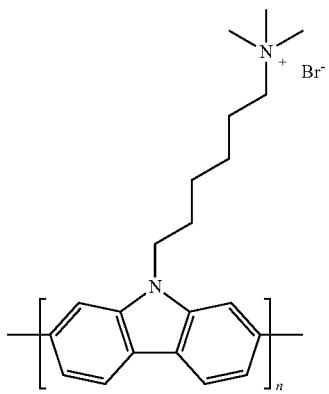

wherein n is an integer in the range of 2 to 1,000.

2. The perovskite solar cell of claim 1, wherein the polymer included in the first polymer electrolyte layer comprises
   a halide ion as a side chain of a core structure, in which the core structure comprises at least one of polyfluorene, carbazole, and polyhexylthiophene, and
   the halide ion comprises at least one of a bromine ion, an iodine ion, and a chlorine ion.

3. The perovskite solar cell of claim 1, wherein the first polymer electrolyte layer is formed of a polymer electrolyte material represented by Formula 1 below:

[Formula 1]

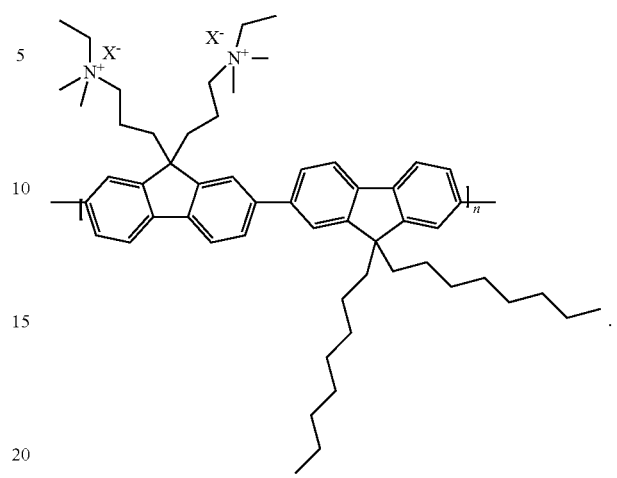

X = Halide ion (I⁻, Br⁻, Cl⁻)

4. The perovskite solar cell of claim 1, wherein the second polymer electrolyte layer is a polymer synthesized based on a carbazole having an amine group as a side chain, represented by Scheme 1 below:

[Scheme 1]

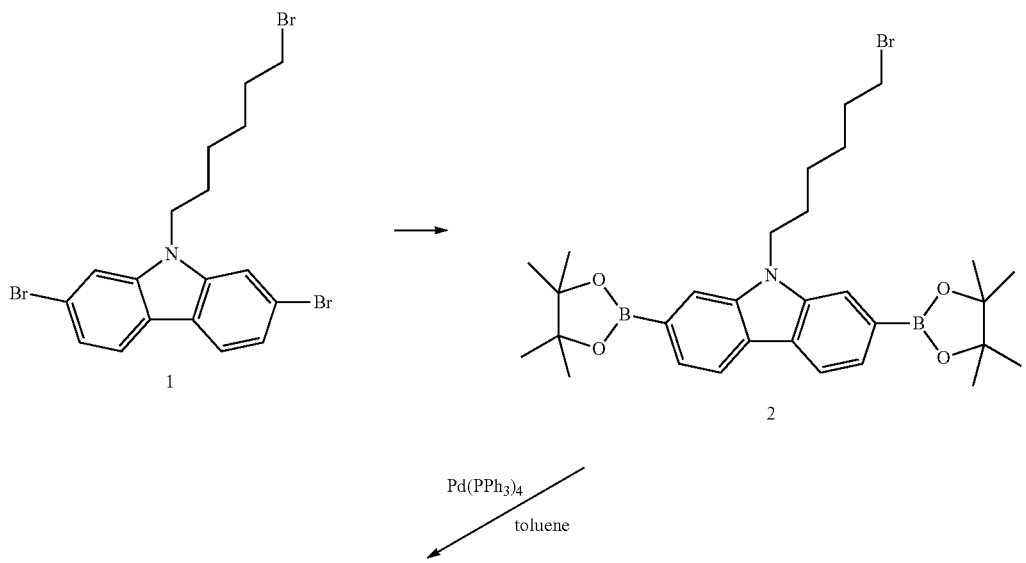

-continued

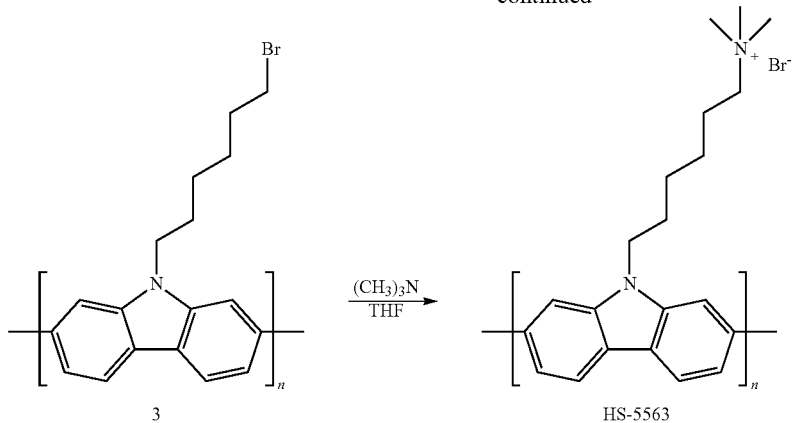

wherein n is an integer in the range of 2 to 1,000.

5. The perovskite solar cell of claim 1, wherein the first polymer electrolyte layer and the second polymer electrolyte layer have a passivation function.

6. The perovskite solar cell of claim 1, wherein, in terms of thermal stability, when the perovskite solar cell is placed on a hot plate maintained at 85° C., its performance is maintained at approximately 80% relative to the initial efficiency even after 1,000 hours, and the perovskite solar cell is maintained at 80% relative to the initial efficiency even after repeating 50 cycles of a process of increasing a temperature from a low temperature to a high temperature, such as −25° C. to 85° C., and then decreasing the temperature to the low temperature.

7. The perovskite solar cell of claim 1, wherein, in terms of photostability, when the perovskite solar cell is exposed to light and measured by a maximum power point tracking method, its performance is maintained at 80% relative to the initial efficiency even after 350 hours.

8. The perovskite solar cell of claim 1, wherein, in terms of stability against air,
    when the perovskite solar cell of the present embodiment is stored while exposed to air, without exposure to sunlight, and its performance is measured periodically, the performance of the solar cell is maintained at 80% relative to the initial efficiency even after 1,500 hours.

* * * * *